United States Patent
Lee et al.

(10) Patent No.: US 10,217,807 B2
(45) Date of Patent: Feb. 26, 2019

(54) ANISOTROPIC CONDUCTIVE FILM AND DISPLAY DEVICE USING THE SAME

(71) Applicant: Samsung Display Co., Ltd, Yongin-si, Gyeonggi-do (KR)

(72) Inventors: Chungseok Lee, Yongin-si (KR); Donghee Park, Yongin-si (KR); Cheolgeun An, Yongin-si (KR); Jihoon Oh, Yongin-si (KR); Euiyun Jang, Yongin-si (KR); Jeongho Hwang, Yongin-si (KR)

(73) Assignee: Samsung Display Co., Ltd. (KR)

( * ) Notice: Subject to any disclaimer, the term of this patent is extended or adjusted under 35 U.S.C. 154(b) by 19 days.

(21) Appl. No.: 15/382,077

(22) Filed: Dec. 16, 2016

(65) Prior Publication Data
US 2017/0352716 A1     Dec. 7, 2017

(30) Foreign Application Priority Data
Jun. 3, 2016    (KR) ................. 10-2016-0069381

(51) Int. Cl.
*H01L 27/32*    (2006.01)
*H01L 23/00*    (2006.01)
*H01L 51/00*    (2006.01)

(52) U.S. Cl.
CPC .......... *H01L 27/3276* (2013.01); *H01L 24/29* (2013.01); *H01L 24/32* (2013.01); *H01L 51/0096* (2013.01); *H01L 2224/13144* (2013.01); *H01L 2224/16238* (2013.01); *H01L 2224/271* (2013.01); *H01L 2224/294* (2013.01); *H01L 2224/29005* (2013.01); *H01L 2224/29028* (2013.01); *H01L 2224/2929* (2013.01); *H01L 2224/2939* (2013.01); *H01L 2224/29083* (2013.01); *H01L 2224/29084* (2013.01); *H01L 2224/29293* (2013.01); *H01L 2224/29391* (2013.01); *H01L 2224/29439* (2013.01); *H01L 2224/29444* (2013.01);
(Continued)

(58) Field of Classification Search
CPC ...... H01L 27/3276; H01L 24/29; H01L 24/32
USPC .................... 257/40, 773, E23.141
See application file for complete search history.

(56) References Cited

U.S. PATENT DOCUMENTS 6,809,280 B2    10/2004   Divigalpitiya et al.
8,518,304 B1*   8/2013    Sammakia ............... H01B 1/22
                                                  174/257
(Continued)

FOREIGN PATENT DOCUMENTS

JP    2007-250464 A    9/2007
JP    2010-168697 A    8/2010
(Continued)

*Primary Examiner* — Robert T Huber
(74) *Attorney, Agent, or Firm* — Innovation Counsel LLP

(57) ABSTRACT

An anisotropic conductive film includes a conductive layer; a first resin insulating layer over a first surface of the conductive layer; and a second resin insulating layer over a second surface of the conductive layer, wherein the conductive layer comprises a plurality of conductive particles and a nano fiber connecting the plurality of conductive particles to each other, each of the plurality of conductive particles comprising a plurality of needle-shaped protrusions having a conical shape, and wherein the first resin insulating layer and the second resin insulating layer comprise a same material and have different thicknesses.

10 Claims, 12 Drawing Sheets

(52) U.S. Cl.
CPC ............. *H01L 2224/29447* (2013.01); *H01L 2224/29455* (2013.01); *H01L 2224/29499* (2013.01); *H01L 2224/32148* (2013.01); *H01L 2224/32225* (2013.01); *H01L 2224/32238* (2013.01); *H01L 2224/743* (2013.01); *H01L 2224/81191* (2013.01); *H01L 2224/831* (2013.01); *H01L 2224/83192* (2013.01); *H01L 2224/83201* (2013.01); *H01L 2224/83203* (2013.01); *H01L 2224/83345* (2013.01); *H01L 2224/83851* (2013.01); *H01L 2224/83862* (2013.01); *H01L 2251/5369* (2013.01); *H01L 2924/07811* (2013.01); *H01L 2924/1426* (2013.01)

(56) References Cited

U.S. PATENT DOCUMENTS

| | | | |
|---|---|---|---|
| 2012/0299888 A1* | 11/2012 | Kim | G02F 1/13452 345/205 |
| 2014/0087255 A1 | 3/2014 | Kim et al. | |
| 2014/0109698 A1 | 4/2014 | Lussey et al. | |
| 2015/0053959 A1* | 2/2015 | Yamazaki | H01L 51/0097 257/40 |

FOREIGN PATENT DOCUMENTS

| | | |
|---|---|---|
| KR | 10-2004-0106447 A | 12/2004 |
| KR | 10-2011-0035067 A | 4/2011 |
| KR | 10-2014-0039603 A | 4/2014 |
| KR | 10-2014-0051159 A | 4/2014 |

* cited by examiner

ANISOTROPIC CONDUCTIVE FILM AND DISPLAY DEVICE USING THE SAME

CROSS-REFERENCE TO RELATED APPLICATION

This application claims the benefit of Korean Patent Application No. 10-2016-0069381, filed on Jun. 3, 2016, in the Korean Intellectual Property Office, the disclosure of which is incorporated herein in its entirety by reference.

BACKGROUND

1. Field

One or more embodiments relate to an anisotropic conductive film and a display device using the anisotropic conductive film.

2. Description of the Related Art

As the field of display devices develops rapidly, research is conducted into the development of various flat panel display devices having excellent characteristics such as a slim profile, light weight, and low power consumption. These display devices may display images by a signal applied to a driving integrated circuit (IC).

In general, the driving IC may be mounted on a display panel through a chip-on-glass (COG) process, a tape carrier package (TCP) process, a chip-on-film (COF) process, etc. When the driving IC is mounted, an anisotropic conductive film may be used, in which conductive particles are distributed in an adhesive resin film.

However, when a driving IC using a general anisotropic conductive film is mounted, an adhesive resin of the anisotropic conductive film may melt and flow during a thermo compression process. As a result, conductive particles may move along a flow of the resin, which may cause a problem where the driving IC is not electrically connected or an unwanted short between electrodes occurs.

SUMMARY

One or more embodiments include an anisotropic conductive film having an excellent electrical connection between pad units and bumps and a display device using the anisotropic conductive film.

Additional aspects will be set forth in part in the description which follows and, in part, will be apparent from the description, or may be learned by practice of the presented embodiments.

According to one or more embodiments, an anisotropic conductive film includes a conductive layer; a first resin insulating layer over a first surface of the conductive layer; and a second resin insulating layer over a second surface of the conductive layer, wherein the conductive layer includes a plurality of conductive particles and a nano fiber connecting the plurality of conductive particles to each other, each of the plurality of conductive particles including a plurality of needle-shaped protrusions each having a conical shape, and wherein the first resin insulating layer and the second resin insulating layer each include a same material and have different thicknesses from each other.

Each of the plurality of conductive particles may include a core having elasticity and a base portion including a metal material and surrounding the core, and wherein the plurality of needle-shaped protrusions are arranged over the base portion.

The base portion and the plurality of needle-shaped protrusions are integrally formed and each may include a same material.

The plurality of conductive particles may be spaced apart from each other.

The nano fiber may include a non-conductive polymer material, the non-conductive polymer material surrounding the plurality of conductive particles.

The conductive layer may further include a base layer in a film form, and the plurality of conductive particles may be arranged in a single layer in the base layer.

According to one or more embodiments, a display device includes a substrate; a display unit over the substrate; a pad unit over one edge of the substrate and connected to the display unit; a driving integrated circuit (IC) electrically connected to the pad unit; and an anisotropic conductive film between the pad unit and the driving IC and electrically connecting the pad unit to the driving IC, wherein the anisotropic conductive film includes an adhesive resin insulating portion and a plurality of conductive particles dispersed in the adhesive resin insulating portion, and wherein each of the plurality of conductive particles includes a surface having a plurality of needle-shaped protrusions each having a conical shape, wherein some of the plurality of needle-shaped protrusions having the conical shape are stuck to the pad unit.

The display unit may include a thin film transistor including an active layer, a gate electrode, a source electrode, and a drain electrode, and wherein the pad unit includes a same material as the source electrode and the drain electrode.

The pad unit may include a first layer, a second layer, and a third layer that are sequentially stacked, and the some of the plurality of needle-shaped protrusions having the conical shape contact the second layer through the third layer.

The first layer and the third layer may each include titanium, and the second layer may include aluminum.

The display unit may include a display element electrically connected to the thin film transistor, and the display element includes a first electrode, a second electrode, and an intermediate layer between the first electrode and the second electrode and including an organic emission layer.

The display device may further include: a thin film encapsulation layer covering and sealing the display unit.

Each of the plurality of conductive particles may include a core having elasticity and a base portion including a metal material and covering an outer surface of the core, and wherein the plurality of needle-shaped protrusions are arranged over the base portion.

The base portion and the plurality of needle-shaped protrusions may include a same material and are integrally formed.

The plurality of conductive particles may be spaced apart from each other.

The plurality of conductive particles may be connected to each other by a nano fiber including a non-conductive polymer material.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
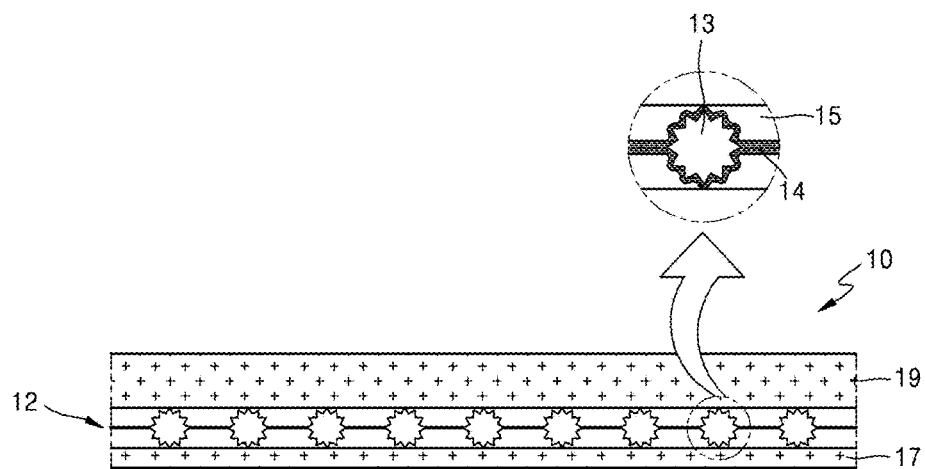
FIG. 1 is a schematic cross-sectional view of an anisotropic conductive film according to an embodiment.

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the following description of the present invention, a detailed description of disclosed technologies will not be provided if they are deemed to make features of the invention obscure.

While such terms as "first", "second", etc., may be used to describe various components, such components must not be limited to the above terms. The above terms are used only to distinguish one component from another.

The terms used in the present specification are merely used to describe particular embodiments, and are not intended to limit the present invention. An expression used in the singular encompasses the expression in the plural, unless it has a clearly different meaning in the context. In the drawings, components can be exaggerated, omitted, or schematically illustrated for convenience and clarity of explanation. In other words, sizes and thicknesses of components in the drawings do not completely reflect actual sizes and thicknesses thereof.

One or more embodiments of the present invention will be described below in more detail with reference to the accompanying drawings. Those components that are the same or are in correspondence are rendered the same reference numeral regardless of the figure number, and redundant explanations are omitted. As used herein, the term "and/or" includes any and all combinations of one or more of the associated listed items. Expressions such as "at least one of," when preceding a list of elements, modify the entire list of elements and do not modify the individual elements of the list.

Figure 2:
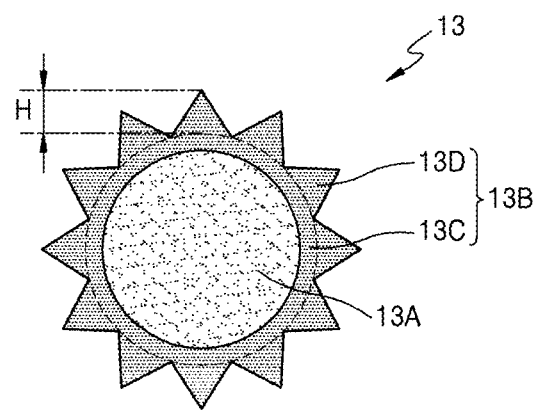
FIG. 2 is a schematic cross-sectional view of an example of conductive particles of the anisotropic conductive film of FIG. 1.
Figure 3:
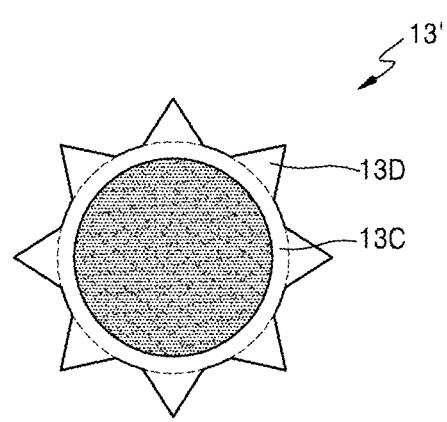
FIG. 3 is a schematic cross-sectional view of another example of conductive particles of the anisotropic conductive film of FIG. 1.

FIG. 1 is a schematic cross-sectional view of an anisotropic conductive film 10 according to an embodiment. FIG. 2 is a schematic cross-sectional view of an example of a plurality of conductive particles 13 of the anisotropic conductive film 10 of FIG. 1. FIG. 3 is a schematic cross-sectional view of another example of a plurality of conductive particles 13' of the anisotropic conductive film 10 of FIG. 1.

Referring to FIGS. 1 and 2, the anisotropic conductive film 10 according to an embodiment may include a conductive layer 12, a first resin insulating layer 17 over a first surface of the conductive layer 12, and a second resin insulating layer 19 over a second surface of the conductive layer 12 that is opposite to the first surface.

The conductive layer 12 may include the plurality of conductive particles 13 and a nano fiber 14 connecting the plurality of conductive particles 13 to each other.

Each of the plurality of conductive particles 13 may include a core 13A and a metal layer 13B surrounding the core 13A, as shown in FIG. 2.

The core 13A may have, for example, a globular shape, and may include a polymer material having elasticity. For example, the core 13A may include a styrene-based polymer such as acrylonitrile butadiene styrene (ABS), polystyrene (PS), etc., an acrylic-based polymer, etc. A diameter of the core 13A may range from about 2 μm to about 3 μm but is not limited thereto. The diameter of the core 13A may be variously set depending on the environment within which the anisotropic conductive film 10 is used.

The metal layer 13B may include a base portion 13C surrounding an outer surface of the core 13A and needle-shaped protrusions 13D over the base portion 13C. The needle-shaped protrusions 13D may have a conical shape. Tips of the needle-shaped protrusions 13D may be arranged in all directions toward the outside. For example, bottoms of the needle-shaped protrusions 13D may densely contact with each other.

As another example, as shown in FIG. 3, bottoms of the needle-shaped protrusions 13D of the conductive particles 13' may be spaced apart from each other. Accordingly, a surface of the base portion 13C may be exposed between the needle-shaped protrusions 13D. As another example, the bottoms of the needle-shaped protrusions 13D may contact each other in one region of the base portion 13C and may be spaced apart from each other in another region of the base portion 13C.

Figure 12:
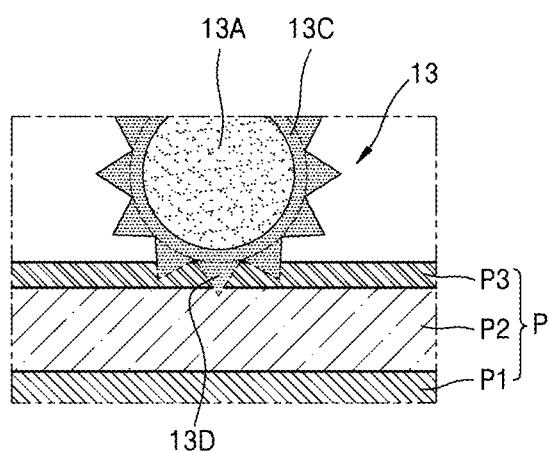
FIG. 12 is an enlarged cross-sectional view of a region E of FIG. 10.

A height H of the needle-shaped protrusion 13D may be greater than a thickness of a third layer P3 of a pad unit P of FIG. 12 that will be described below. For example, the height H of the needle-shaped protrusion 13D may range from about 300 nm to about 500 nm but is not limited thereto. In this regard, the height H of the needle-shaped protrusion 13D may mean a distance from the surface of the base portion 13C to a tip of the corresponding needle-shaped protrusion 13D.

The needle-shaped protrusions 13D and the base portion 13C may include the same material and may be integrally formed. For example, the base portion 13C and the needle-shaped protrusions 13D may include nickel, gold, silver, copper, or an alloy of these. For example, the metal layer 13B may include nickel in order to form the needle-shaped protrusions 13D having an excellent rigidity.

The plurality of conductive particles 13 may be connected to each other by the nano fiber 14. The nano fiber 14 may include a non-conductive polymer material. The non-conductive polymer material may surround and connect the plurality of conductive particles 13 to each other.

The non-conductive polymer material of the nano fiber 14 may include polybutylene succinate (PBS), polyolefine, polyamide, polyester, aramide, acrylic, polyethylene oxide (PEO), polycaprolactone, polycarbonate, polystyrene, polyethylene terephthalate, polybenzimidazole (PBI), poly(2-hydroxyethyl methacrylate), polyvinylidene fluoride, poly (ether imide), styrene-butadiene-styrene (SBS) triblock copolymer, or a mixture of these.

The plurality of conductive particles 13 connected to each other by the nano fiber 14 may be spaced apart from each other by a predetermined gap. This will be described with reference to FIGS. 4 through 6 below.

The conductive layer 12 may further include a base layer 15 in which the plurality of conductive particles 13 are arranged. The plurality of conductive particles 13 may be arranged in a single layer in the base layer 15. The base layer 15 may facilitate formation of the first resin insulating layer 17 and the second resin insulating layer 19 and may fix locations of the plurality of conductive particles 13 and the nano fiber 14 until the first resin insulating layer 17 and the second resin insulating layer 19 are formed.

The base layer 15 may include epoxy, acryl, cyanate ester, silicon, polyurethane, or a mixture of any number of these. A thickness of the base layer 15 may range from, for example, about 3 µm to about 5 µm, but is not limited thereto. The thickness of the base layer 15 may vary.

The first resin insulating layer 17 and the second resin insulating layer 19 may include epoxy, acryl, cyanate ester, silicon, polyurethane, or a mixture of any number of these. The first resin insulating layer 17 and the second resin insulating layer 19 may have different thicknesses. For example, the first resin insulating layer 17 may have a thickness ranging from about 3 µm to about 5 µm, and the second resin insulating layer 19 may have a thickness ranging from about 6 µm to about 13 µm. However, the embodiments are not limited thereto. Thicknesses of the first resin insulating layer 17 and the second resin insulating layer 19 may be variously set according to a condition for using the anisotropic conductive film 10 such as sizes of spaces between bumps 420 of FIG. 10, to which the anisotropic conductive film 10 is attached, sizes of spaces between the pad units P, etc.

Figure 4:
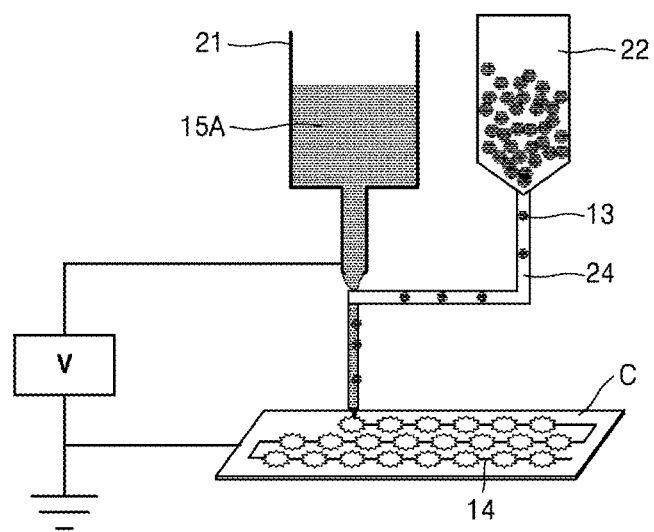
FIG. 4 is a schematic perspective view for describing a method of manufacturing the anisotropic conductive film of FIG. 1.
Figure 5:
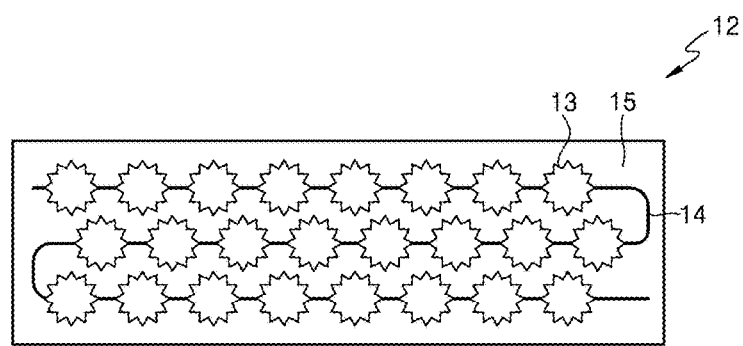
FIG. 5 is a schematic plan view of an example of a conductive layer of the anisotropic conductive film of FIG. 1.
Figure 6:
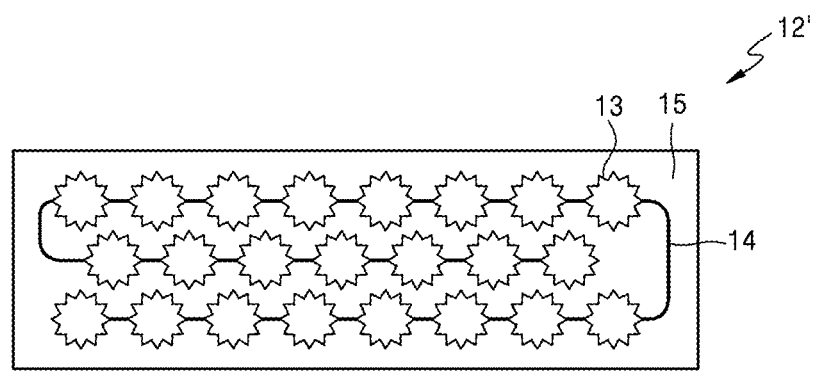
FIG. 6 is a schematic plan view of another example of a conductive layer of the anisotropic conductive film of FIG. 1.

FIG. 4 is a schematic perspective view for describing a method of manufacturing the anisotropic conductive film 10 of FIG. 1. FIG. 5 is a schematic plan view of an example of the conductive layer 12 of the anisotropic conductive film 10 of FIG. 1. FIG. 6 is a schematic plan view of another example of a conductive layer 12' of the anisotropic conductive film 10 of FIG. 1.

FIG. 4 shows a method of forming the conductive layer 12 by using an electro-spinning method.

Referring to FIG. 4, a melted liquid may include a non-conductive polymer material and may be filled in a first syringe 21 including a nozzle. For example, the melted liquid may comprise polyisobutylene succinate melted in chloroform but is not limited thereto.

If a voltage is applied between the first syringe 21 and a collector C, the melted liquid may be electrified, and an electric field may be formed between the first syringe 21 and the collector C. In this state, if the melted liquid is pushed through the nozzle by applying injection pressure to the first syringe 21, a molecule combination may occur in the electrified melted liquid, and thus the melted liquid may be sprayed in a fiber form through the nozzle, a solvent may evaporate from the sprayed melted liquid, and the nano fiber 14 may be collected on the collector C. The nano fiber 14 may have a thickness or a diameter ranging from about 500 nm to about 700 nm, but is not limited thereto. The thickness or the diameter of the nano fiber 14 may be variously adjusted by adjusting the magnitude of the electric field formed between the first syringe 21 and the collector C, the injection pressure applied to the first syringe 21, etc.

The conductive particles 13 may be filled in a second syringe 22. A pipe 24 connected to an end of the second syringe 22 may inject the conductive particles 13 into a liquid jet of the melted liquid sprayed through the nozzle. The second syringe 22 may control supply or non-supply of the conductive particles 13 at a uniform period. Thus, when the nano fiber 14 is formed, the second syringe 22 may supply the conductive particles 13 into the liquid jet of the melted liquid at the uniform period so that the nano fiber 14 may include the conductive particles 13 arranged with a predetermined gap of a length of nano fiber 14.

The nano fiber 14 connected by the collector C may undergo a thermo compression process, and thus the conductive particles 13 may be arranged in a single layer. During a process of forming the nano fiber 14, the collector C may move with a uniform pattern. Thus, the nano fiber 14 may have a specific pattern, as shown in FIGS. 5 and 6, and the conductive particles 13 may be regularly arranged. For example, FIG. 5 shows the example of the conductive layer 12 including nano fiber 14 having a zigzag pattern, and FIG. 6 shows the example of the conductive layer 12' including the nano fiber 14 having a spiral pattern, where the conductive particles 13 of FIGS. 5 and 6 may be arranged in three lines, may be spaced apart from each other by a predetermined gap, and may be regularly arranged.

A location of the nano fiber 14 collected by the collector C may be fixed by the base layer 15. The base layer 15 may be formed, for example, by mixing the nano fiber 14 and resin in a melting state for forming the base layer 15 when the nano fiber 14 collected by the collector C is thermally compressed. As another example, the base layer 15 may be formed by laminating a film for forming the base layer 15 to the nano fiber 14 collected by the collector C.

After the conductive layer 12 is formed, the first resin insulating layer 17 of FIG. 1 and the second resin insulating layer 19 of FIG. 1 may be respectively formed on the first and second surfaces of the conductive layer 12, and thus the anisotropic conductive film 10 of FIG. 1 may be formed.

Figure 7:
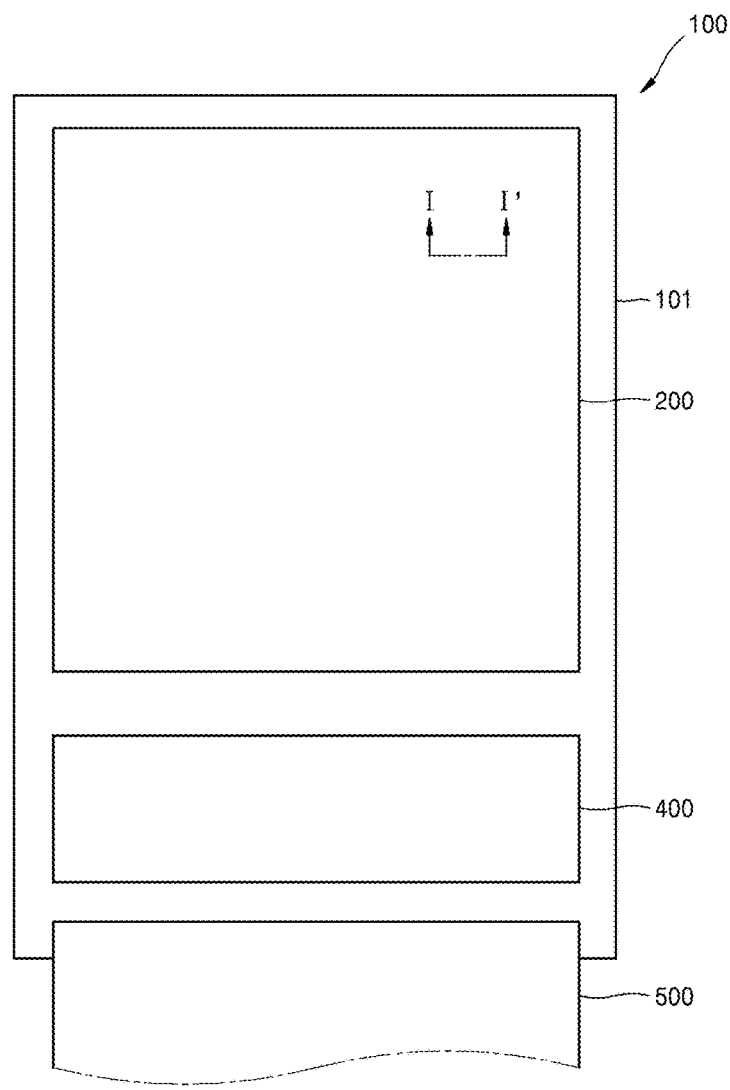
FIG. 7 is a schematic plan view of a display device according to an embodiment.
Figure 8:
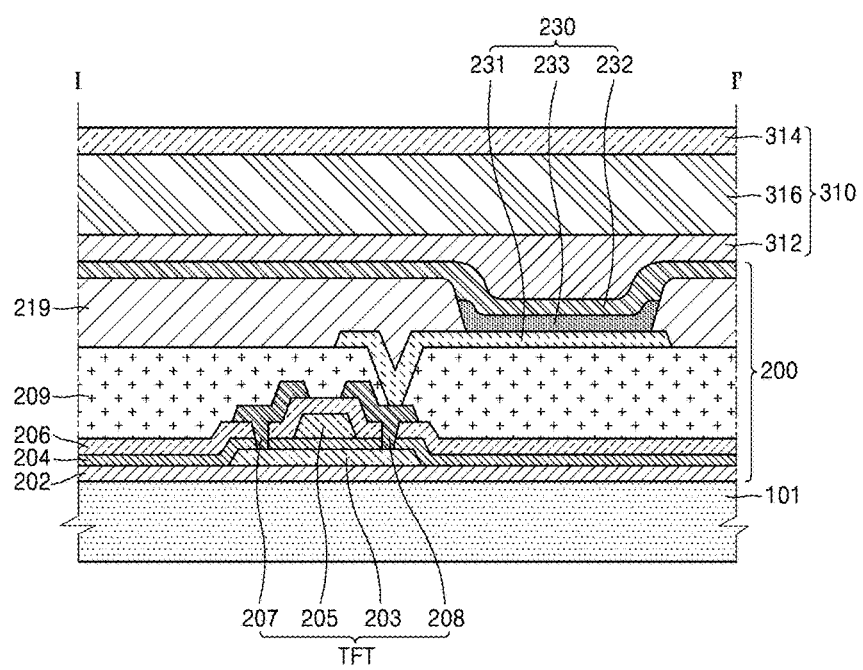
FIG. 8 is a schematic cross-sectional view of an example taken along a line I-I' of FIG. 7.
Figure 9:
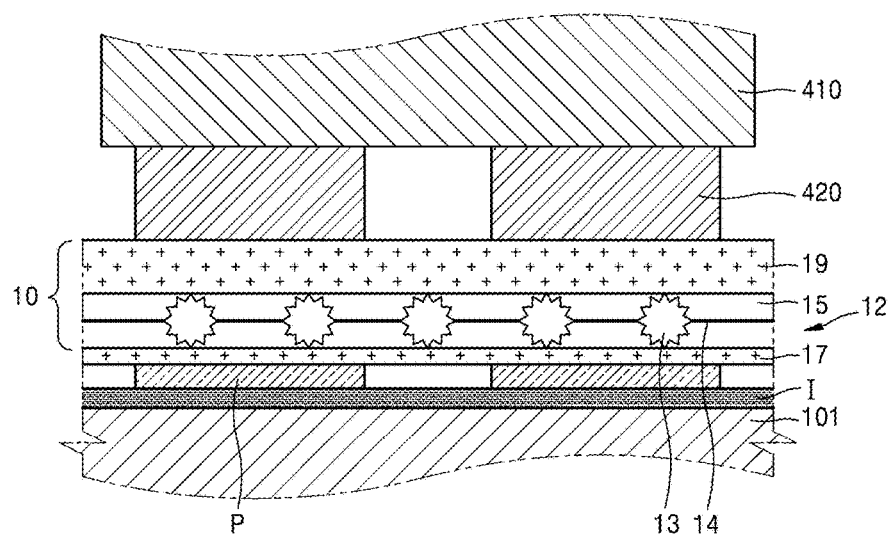
FIGS. 9 and 10 are schematic cross-sectional views of a process of attaching a driving integrated circuit (IC) to the display device of FIG. 7.
Figure 10:
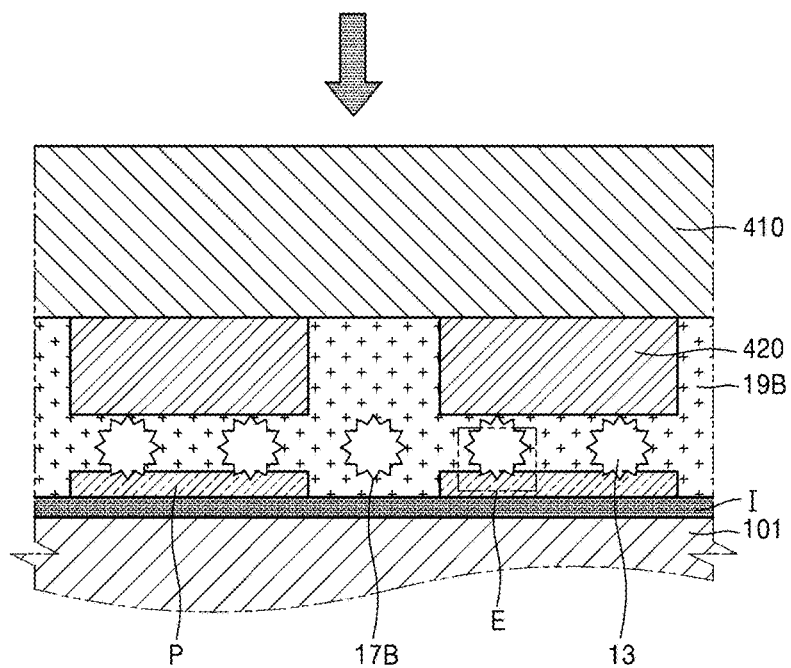
Figure 11:
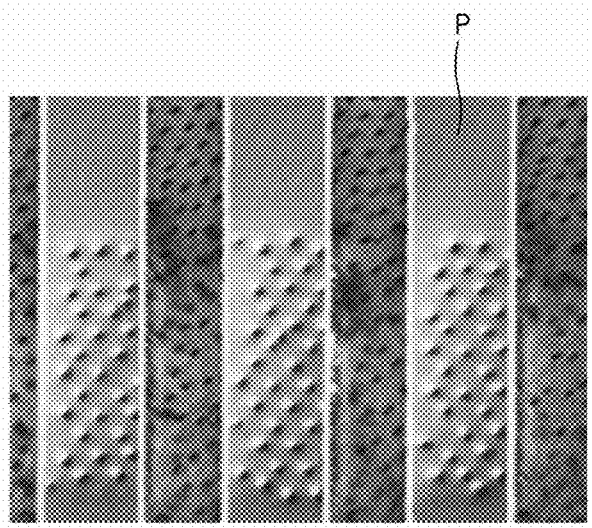
FIG. 11 is a plan view of a pad unit of the display device of FIG. 7.

FIG. 7 is a schematic plan view of a display device 100 according to an embodiment. FIG. 8 is a schematic cross-sectional view of an example taken along a line I-I' of FIG. 7. FIGS. 9 and 10 are schematic cross-sectional views of a process of attaching a driving IC to the display device 100 of FIG. 7. FIG. 11 is a plan view of the pad unit P of the display device 100 of FIG. 7. FIG. 12 is an enlarged cross-sectional view of a region E of FIG. 10.

Referring to FIGS. 7 through 12, the display device 100 according to an embodiment may include a substrate 101, a display unit 200 over the substrate 101, and a thin film encapsulation layer 310 sealing the display unit 200. The display device 100 may include the pad unit P arranged over one edge of the substrate 101, a driving IC 400 applying a driving signal to the pad unit P, and a flexible printed circuit (FPC) 500 transmitting predetermined data and a control signal to the driving IC 400.

The substrate 101 may include various materials. For example, the substrate 101 may include a transparent glass material having $SiO_2$ as a main component, but is not necessarily limited thereto. The substrate 101 may include a plastic material. The plastic material may include polyethersulphone (PES), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose tri acetate (TAC), cellulose acetate propionate (CAP), cellulose acetate propionate (CAP), cyclic olefin polymer, cyclic olefin copolymer, etc.

The display unit 200 may be formed over the substrate 101 and may produce an image. The display unit 200 may include, for example, a display element such as a thin film transistor TFT. For example, the display element may include an organic light-emitting device (OLED) 230. However, the embodiments are not limited thereto. The display unit 200 may include various types of display elements.

A buffer layer 202 may be formed over the substrate 101. For example, the buffer layer 202 may include an inorganic material such as silicon oxide, silicon nitride, silicon oxynitride, aluminum oxide, aluminum nitride, titanium oxide, or titanium nitride, etc., or an organic material such as polyimide, polyester, or acryl, etc., and may have a plurality of stack structures of these materials.

The thin film transistor TFT may include an active layer 203, a gate electrode 205, a source electrode 207, and a drain electrode 208. A case where the thin film transistor TFT is of a top gate type in which the active layer 203, the gate electrode 205, the source electrode 207, and the drain electrode 208 are sequentially formed will now be described. However, the present embodiment is not limited thereto. Various types of thin film transistors TFT, such as a bottom gate type thin film transistor, may be employed.

The active layer 203 may include a semiconductor material, for example, amorphous silicon or polycrystalline silicon. However, the present embodiment is not limited thereto. The active layer 203 may include various materials. As an alternative embodiment, the active layer 203 may include an organic semiconductor material or the like. As another alternative embodiment, the active layer 203 may include an oxide semiconductor material. For example, the active layer 203 may include an oxide of a material selected from Group 12, 13, and 14 metal elements such as zinc (Zn), indium (In), gallium (Ga), stannum (Sn), cadmium (Cd), and germanium (Ge)), or a combination thereof.

A gate insulating layer 204 may be formed over the active layer 203. The gate insulating layer 204 may have a multilayer structure or a single layer structure including layers including an inorganic material such as silicon oxide and/or silicon nitride, etc. The gate insulating layer 204 may insulate the active layer 203 and the gate electrode 205 from each other.

The gate electrode 205 may be formed above the gate insulating layer 204. The gate electrode 205 may be connected to a gate line (not shown) that applies an ON/OFF signal to the thin film transistor TFT. The gate electrode 205 may include a low resistance metal material. For example, the gate electrode 205 may include one or more materials of aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and copper (Cu), in a single layer structure or a multilayer structure.

An interlayer insulating layer 206 may be formed over the gate electrode 205. The interlayer insulating layer 206 may insulate the source electrode 207 and the drain electrode 208 from the gate electrode 205. The interlayer insulating layer 206 may have a multilayer structure or a single layer structure including layers including an inorganic material. For example, the inorganic material may be a metal oxide or a metal nitride. In more detail, the inorganic material may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), zirconium oxide ($ZrO_2$), or the like.

The source electrode 207 and the drain electrode 208 may be formed over the interlayer insulating layer 206. The source electrode 207 and the drain electrode 208 may contact a region of the active layer 203. Each of the source electrode 207 and the drain electrode 208 may include one or more materials of aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and copper (Cu) in a single layer structure or a multilayer structure. For example, the source electrode 207 and the drain electrode 208 may have a triple layer stack structure of titanium (Ti), aluminum (Al), and titanium (Ti).

A passivation layer 209 may be formed to cover the thin film transistor TFT. The passivation layer 209 may resolve steps caused by the thin film transistor TFT and planarize an upper surface thereof, thereby preventing a defect from occurring in the OLED 230 by lower unevenness.

The passivation layer 209 may have a single layer structure or a multilayer structure including layers including an organic material. The organic material may include a commercial polymer such as polymethyl methacrylate (PMMA) or PS, a polymer derivative having a phenol-based group, an acryl-based polymer, an imide-based polymer, an acryl ether-based polymer, an amide-based polymer, a fluorine-based polymer, a p-xylene-based polymer, a vinyl alcohol-based polymer, a blend thereof, or the like. The passivation layer 209 may be a composite stack of inorganic insulating layers and organic insulating layers.

The OLED 230 may be formed over the passivation layer 209. The OLED 230 may include a first electrode 231, a second electrode 232 facing the first electrode 231, and an intermediate layer 233 between the first electrode 231 and the second electrode 233.

The first electrode 231 may be electrically connected to the source electrode 207 or the drain electrode 208. The first electrode 231 may have various shapes. For example, the first electrode 231 may be patterned to have an island shape.

The first electrode 231 may be formed over the passivation layer 209 and may be electrically connected to the thin film transistor TFT through a contact hole formed in the passivation layer 209. The first electrode 231 may be, for example, a reflective electrode. For example, the first electrode 231 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or a compound thereof, and a transparent electrode layer formed over the reflective layer. The transparent electrode layer may include one or more materials selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

The second electrode 232 facing the first electrode 231 may have various shapes, and, for example, may be patterned to have an island shape. The second electrode 232 may be, for example, a transparent electrode. The second electrode 232 may include a metal thin film having a small work function, including Li, Ca, LiF/Ca, LiF/Al, Al, Ag, Mg, or a combination thereof. An auxiliary electrode layer or a bus electrode may include a material, such as ITO, IZO, ZnO, or $In_2O_3$, etc. and may be further formed over the metal thin film. Accordingly, the second electrode 232 may transmit light emitted from an organic emission layer included in the intermediate layer 233. In other words, the light emitted by the organic emission layer may be reflected directly or by the first electrode 231 formed as the reflective electrode and then discharged toward the second electrode 232.

However, the display unit 200 of the present embodiment is not limited to a top-emission type. The display unit 200 may be a bottom-emission type in which the light emitted by the organic emission layer is emitted toward the substrate 101. In this case, the first electrode 231 may be a transparent electrode, and the second electrode 232 may be a reflective electrode. The display unit 200 of the present embodiment may be of a dual emission type that emits light in both directions of top and bottom surfaces of the display unit 200 of the present embodiment.

A pixel defining layer 219 may include an insulating material and may be formed over the first electrode 231. The pixel defining layer 219 may include one or more organic insulating materials selected from the group consisting of polyimide, polyamide (PA), acryl resin, benzocyclobutene (BCB), and a phenolic resin, by using a method such as spin coating. The pixel defining layer 219 may expose a predetermined area of the first electrode 231. The intermediate layer 233 including the organic emission layer may be in the exposed area of the first electrode 231. In other words, the pixel defining layer 219 may define a pixel area of the OLED 230.

The organic emission layer included in the intermediate layer 233 may include a low molecular weight organic material or a high molecular weight organic material. The intermediate layer 233 may selectively further include functional layers, such as a hole transport layer (HTL), a hole injection layer (HIL), an electron transport layer (ETL), an electron injection layer (EIL), etc., in addition to the organic emission layer.

The thin film encapsulation layer 310 may be formed over the second electrode 232 and may seal the display unit 200. The thin film encapsulation layer 310 may prevent penetration of external oxygen and moisture, etc. and may have a single layer structure or a multilayer structure.

The thin film encapsulation layer 310 may include at least one organic layer 316 and one or more inorganic layers 312 and 314. The at least one organic layer 316 and the one or more inorganic layers 312 and 314 may be alternately stacked. FIG. 8 illustrates an example in which the thin film encapsulation layer 310 includes two inorganic layers 312 and 314 and an organic layer 316, but embodiments are not limited thereto. That is, the thin film encapsulation layer 310 may further include a plurality of inorganic layers and organic layers that are alternately disposed. The number of stacked inorganic layers and organic layers is not limited.

The inorganic layers 312 and 314 may include one or more materials selected from the group consisting of, for example, silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride (SiON).

The organic layer 316 may planarize any steps caused by the pixel defining layer 219 and relax any stress generated by the inorganic layers 312 and 314. The organic layer 316 may include PMMA, PC, PS, an acrylic-based resin, an epoxy-based resin, PI, polyethylene, etc.

Although not shown, the inorganic layers 312 and 314 may have a larger area than the organic layer 316. Thus, the inorganic layers 312 and 314 may contact each other at least an edge of the organic layer 316, thereby more effectively preventing penetration of external oxygen or moisture.

The pad unit P may be arranged over one edge of the substrate 101 and may be connected to the display unit 200. More specifically, the pad unit P may be connected to a gate line and a data line and may transfer a scan signal and a data signal to the display unit 200 through the gate line and the data line, respectively.

The pad unit P may include the same material as the source electrode 207 and the drain electrode 208. For example, the pad unit P may include a first layer P1, a second layer P2, and a third layer P3 that are sequentially stacked as shown in FIG. 12. In this regard, the first layer P1 and the third layer P3 may include titanium, and the second layer P2 may include aluminum.

The driving IC 400 may be electrically connected to the pad unit P and may apply a driving signal to the pad unit P. The driving IC 400 may include an IC chip 410 and a plurality of bumps 420. For example, the bumps 420 may include gold (Au).

The driving IC 400 may be mounted on the substrate 101 through a chip-on-glass (COG) process. Thus, no printed circuit board (PCB) may be necessary, thereby achieving a high concentration and increasing a display region of the display unit 200. An insulating layer I may be formed over a first surface of the substrate 101. The insulating layer I may be the buffer layer 202, the gate insulating layer 204, and the intermediate insulating layer 206.

The driving IC 400 may be mounted on the substrate 101 by compressing the anisotropic conductive film 10 between the driving IC 400 and the pad unit P at a high temperature. A method of mounting the driving IC 400 will be described in more detail with reference to FIGS. 9 and 10 below.

As shown in FIG. 9, the anisotropic conductive film 10 may be disposed between the bump 420 of the driving IC 400 and the pad unit P.

The anisotropic conductive film 10 may include the conductive layer 12, the first resin insulating layer 17 over a first surface of the conductive layer 12, and the second resin insulating layer 19 over a second surface of the conductive layer 12 that is opposite to the first surface, as described with reference to FIG. 1 above.

The conductive layer 12 may include the plurality of conductive particles 13 and the nano fiber 14 connecting the plurality of conductive particles 13 to each other. The plurality of conductive particles 13 may include the needle-shaped protrusions 13D of FIG. 12, which have surfaces of a conical shape. The plurality of conductive particles 13 connected to each other by the nano fiber 14 may be spaced apart from each other by a predetermined gap.

The first resin insulating layer 17 and the second resin insulating layer 19 may have different thicknesses. In this regard, if spaces between the bumps 420 are greater than spaces between the pad units P, the second resin insulating layer 19 having a greater thickness than the first resin insulating layer 17 may be arranged toward the driving IC 400.

Thereafter, if the driving IC 400 is thermally compressed, as shown in FIG. 10, the first resin insulating layer 17 and the second resin insulating layer 19 may be melted, and thus adhesive resin insulating portions 17B and 19B may be formed, and the nano fiber 14 surrounding and connecting the plurality of conductive particles 13 to each other may also be melted, and thus the bump 420 and the pad unit P may be electrically connected to each other by the exposed conductive particles 13.

More specifically, the adhesive resin insulating portion 19B mainly filling regions between the plurality of bumps 420 may be formed by melting the second resin insulating layer 19, and the adhesive resin insulating portion 17B mainly filling regions between the pad units P may be formed by melting the first resin insulating layer 17. When the regions between the plurality of bumps 420 are larger than the regions between the pad units P, a thickness of the second resin insulating layer 19 may be greater than a thickness of the first resin insulating layer 17, and thus the regions between the plurality of bumps 420 may be sufficiently filled. The base layer 15 of FIG. 1 that may be included in the conductive layer 12 may be melted when the driving IC 400 is thermally compressed, and thus, the base layer 15 and the first resin insulating layer 17 and the second resin insulating layer 19 may form the adhesive resin insulating portions 17B and 19B.

The nano fiber 14 may include a material having a glass transition temperature Tg that is higher than those of the first resin insulating layer 17 and the second resin insulating layer 19, so that the nano fiber 14 may be melted later than the first resin insulating layer 17 and the second resin insulating layer 19. Thus, when the first resin insulating layer 17 and the second resin insulating layer 19 are melted and filled between the regions between the plurality of bumps 420 and between the regions between the pad units P, the plurality of conductive particles 13 may be connected to each other by the nano fiber 14, thereby preventing the plurality of conductive particles 13 from moving to the outside of the pad units P by a flow of a resin in which the first resin insulating layer 17 and the second resin insulating layer 19 are melted.

When the nano fiber 14 is melted, the plurality of conductive particles 13 between the bump 420 and the pad unit P may be prevented from escaping due to their fixed locations, thereby preventing a connection defect between the bump 420 and the pad unit P and occurrence of an electrical short between the bumps 420 or the pad units P when the driving IC 400 is mounted. A non-conductive polymer material forming the melted nano fiber 14 may be mixed in the adhesive resin insulating portions 17B and 19B.

During a process of thermally compressing the pad unit P, the nano fiber 14 may be cut into pieces due to a disconnection of the nano fiber 14, etc. If the nano fiber 14 is cut into pieces between the bump 420 and the pad unit P, pieces of the nano fiber 14 may be moved to outside the pad unit P by the flow of the melted resin of the first resin insulating layer 17 and the second resin insulating layer 19. If the nano fiber 14 is cut into pieces between the bumps 420 or between the pad units P, the pieces of the nano fiber 14 may remain. The pieces of the nano fiber 14 between the bumps 420 or between the pad units P may not all be melted, and as a result, the pieces of the nano fiber 14 may remain between the bumps 420 or between the pad units P.

The plurality of conductive particles 13 may be spaced apart from each other by a predetermined gap by the nano fiber 14, and thus, the plurality of conductive particles 13 may be regularly arranged between the pad units P and between the bumps 420. This, as shown in FIG. 11, may be clear from a regular indentation shape of the plurality of conductive particles 13 appearing on the pad unit P.

In addition, it may be possible to adjust gaps between the plurality of conductive particles 13, and thus a stable electrical connection between the bump 420 and the pad unit P may be possible. For example, when a width of the bump 420 is c, a size of the conductive particle 13 is p, and a gap between the conductive particles 13 is d, in order to satisfy a condition that at least two conductive particles 13 are arranged within the width of one bump 420, the gap d between the conductive particles 13 may have a value equal to or less than $c/2-p$. Thus, although the pad units P have a fine pitch, an electrical connection may be stably possible only in a desired location.

The plurality of conductive particles 13 may have sizes ranging from about 3 μm to about 5 μm. In this regard, the size of the plurality of conductive particles 13 may mean a distance between tips of the needle-shaped protrusions 13D at opposite sides and, when the conductive particle 13 is pressed by a thermal compression for mounting the driving IC 400, may mean a size measured at a minimum distance. When the size of the conductive particle 13 is greater than 5 μm, a short may occur between the pad units P or between the bumps 420. When the size of the conductive particle 13 is less than 3 μm, a connection between the driving IC 400 and the pad unit P may be difficult and may also increase resistance.

Some of the needle-shaped protrusions 13D having a conical shape formed on surfaces of the plurality of conductive particles 13 may be stuck to the pad unit P during the thermal compression for mounting the driving IC 400. In more detail, as shown in FIG. 12, when the pad unit P has a stack structure of the first layer P1, the second layer P2, and the third layer P3, the needle-shaped protrusions 13D may contact the second layer P2 through the third layer P3. As described above, the first layer P1 and the third layer P3 may include titanium, and the second layer P2 may include aluminum. The needle-shaped protrusion 13D may contact the second layer P2 having a more excellent conductivity than that of the third layer P3, and thus the electrical connection between the conductive particle 13 and the pad unit P may be further enhanced. A titanium oxide (TiOx) layer may be formed on a surface of the third layer P3 including titanium. In this regard, the needle-shaped protrusion 13D may contact the second layer P2, thereby preventing an increase in connection resistance and integrally forming the plurality of needle-shaped protrusions 13D and the base portion 13C, and thus the electrical connection between the pad unit P and the bump 420 may be enhanced.

To this end, a height H of the needle-shaped protrusion 13D may be greater than a thickness of the third layer P3. For example, a thickness of the first layer P1 may range from about 500 nm to about 800 nm, a thickness of the second layer P2 may range from about 4700 nm to about 5300 nm, the thickness of the third layer P3 may range from about 200 nm to about 400 nm, and the height H of the needle-shaped protrusion 13D may range from about 300 nm to about 500 nm.

During the thermal compression for mounting the driving IC 400, the plurality of conductive particles 13 may be pressed, and accordingly, a shape of the core 13A may change. For example, when the core 13A initially has a globular shape, after the driving IC 400 is mounted, the core 13A may have an oval shape having a minor axis formed in a thickness direction of the display device 100. The volume of the adhesive resin insulating portions 17B and 19B may change depending on an environment in which the display device 100 is used. For example, when the display device 100 is used in a high moisture environment, the adhesive resin insulating portions 17B and 19B may absorb moisture and expand. In this regard, the core 13A including a polymer material having elasticity may be restored to its original shape owing to elasticity, and accordingly, although a gap between the pad unit P and the bump 420 increases due to expansion of the adhesive resin insulating portions 17B and 19B, the electrical connection between the driving IC 400 and the pad unit P may be stably maintained.

As described above, according to embodiments, an anisotropic conductive film may prevent escape from locations of conductive particles between bumps of a driving IC and pad units when the driving IC is mounted and may enable a stable electrical connection between the driving IC and pad units. The scope of the disclosure is not limited by this effect.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A display device comprising:
   a substrate;
   a display unit over the substrate;
   a pad unit over one edge of the substrate and connected to the display unit;
   a driving integrated circuit (IC) electrically connected to the pad unit; and
   an anisotropic conductive film between the pad unit and the driving IC and electrically connecting the pad unit to the driving IC,
   wherein the anisotropic conductive film comprises an adhesive resin insulating portion and a plurality of conductive particles dispersed in the adhesive resin insulating portion, and
   wherein each of the plurality of conductive particles comprises a surface having a plurality of needle-shaped protrusions each having a conical shape, wherein some of the plurality of needle-shaped protrusions having the conical shape are stuck to the pad unit,
   wherein the pad unit comprises a second layer and a third layer that are sequentially stacked, and
   wherein the some of the plurality of needle-shaped protrusions having the conical shape contact the second layer through the third layer.

2. The display device of claim 1,
   wherein the display unit comprises a thin film transistor comprising an active layer, a gate electrode, a source electrode, and a drain electrode, and
   wherein the pad unit comprises a same material as the source electrode and the drain electrode.

3. The display device of claim 2,
   wherein the pad unit further comprises a first layer, the second layer being stacked on the first layer.

4. The display device of claim 3, wherein the first layer and the third layer each comprise titanium, and the second layer comprises aluminum.

5. The display device of claim 2,
   wherein the display unit comprises a display element electrically connected to the thin film transistor, and
   wherein the display element comprises a first electrode, a second electrode, and an intermediate layer between the first electrode and the second electrode and comprising an organic emission layer.

6. The display device of claim 1, further comprising: a thin film encapsulation layer covering and sealing the display unit.

7. The display device of claim 1,
   wherein each of the plurality of conductive particles comprises a core having elasticity and a base portion including a metal material and covering an outer surface of the core, and
   wherein the plurality of needle-shaped protrusions are arranged over the base portion.

8. The display device of claim 7, wherein the base portion and the plurality of needle-shaped protrusions comprise a same material and are integrally formed.

9. The display device of claim 1, wherein the plurality of conductive particles are spaced apart from each other.

10. The display device of claim 1, wherein the plurality of conductive particles are connected to each other by a nano fiber comprising a non-conductive polymer material.

* * * * *